US008541328B2

(12) United States Patent
Watanabe et al.

(10) Patent No.: US 8,541,328 B2
(45) Date of Patent: Sep. 24, 2013

(54) CERAMIC MATERIAL, MEMBER FOR SEMICONDUCTOR MANUFACTURING EQUIPMENT, SPUTTERING TARGET MEMBER AND METHOD FOR PRODUCING CERAMIC MATERIAL

(75) Inventors: Morimichi Watanabe, Nagoya (JP); Asumi Jindo, Okazaki (JP); Yuji Katsuda, Tsushima (JP); Yosuke Sato, Hashima-County (JP); Yoshinori Isoda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/478,591

(22) Filed: May 23, 2012

(65) Prior Publication Data
US 2012/0231945 A1    Sep. 13, 2012

Related U.S. Application Data

(63) Continuation of application No. PCT/JP2011/073330, filed on Oct. 11, 2011.

(30) Foreign Application Priority Data

Oct. 25, 2010   (JP) ................................ 2010-238999
Jun. 17, 2011   (JP) ................................ 2011-135313
Aug. 29, 2011   (WO) .................. PCT/JP2011/069491

(51) Int. Cl.
*C04B 35/00*    (2006.01)
(52) U.S. Cl.
USPC .......................... 501/98.5; 501/98.4; 501/96.1
(58) Field of Classification Search
USPC ............. 501/96.1, 96.2, 98.4, 98.5; 423/385, 423/406, 409, 412; 51/293
See application file for complete search history.

(56) References Cited

U.S. PATENT DOCUMENTS 3,531,245 A    9/1970   Dietz
5,231,062 A    7/1993   Mathers et al.
(Continued)

FOREIGN PATENT DOCUMENTS

JP    62-028917 A1    2/1987
JP    04-304359 A1    10/1992
(Continued)

OTHER PUBLICATIONS

Granon et al. Aluminum Magnesium Oxynitride: A New Transparent Spinel Ceramic. Journal of the European Ceramic Society 15 (1995) 249-254.*

(Continued)

*Primary Examiner* — Kaj Olsen
*Assistant Examiner* — Noah Wiese
(74) *Attorney, Agent, or Firm* — Burr & Brown

(57) ABSTRACT

A ceramic material according to the present invention mainly contains magnesium, aluminum, oxygen, and nitrogen, the ceramic material has the crystal phase of a MgO—AlN solid solution in which aluminum nitride is dissolved in magnesium oxide, the crystal phase serving as a main phase. Preferably, XRD peaks corresponding to the (200) and (220) planes of the MgO—AlN solid solution measured with CuKα radiation appear at 2θ=42.9 to 44.8° and 62.3 to 65.2°, respectively, the XRD peaks being located between peaks of cubic magnesium oxide and peaks of cubic aluminum nitride. More preferably, the XRD peak corresponding to the (111) plane appears at 2θ=36.9 to 39°, the XRD peak being located between a peak of cubic magnesium oxide and a peak of cubic aluminum nitride.

20 Claims, 4 Drawing Sheets

(56) References Cited

U.S. PATENT DOCUMENTS

| | | | |
|---|---|---|---|
| 5,314,675 A * | 5/1994 | Dubots et al. | 423/344 |
| 5,336,280 A * | 8/1994 | Dubots et al. | 51/293 |
| 5,457,075 A | 10/1995 | Fukushima et al. | |
| 6,239,402 B1 | 5/2001 | Araki et al. | |
| 7,255,934 B2 * | 8/2007 | Hatono et al. | 428/688 |
| 2003/0128483 A1 | 7/2003 | Kamijo | |
| 2005/0173412 A1 | 8/2005 | Kondou et al. | |
| 2006/0240972 A1 | 10/2006 | Lee et al. | |
| 2007/0258281 A1 | 11/2007 | Ito et al. | |
| 2010/0104892 A1 | 4/2010 | Kobayashi et al. | |

FOREIGN PATENT DOCUMENTS

| | | | |
|---|---|---|---|
| JP | 05-319937 A1 | 12/1993 | |
| JP | 06-037207 A1 | 2/1994 | |
| JP | 2000-044345 A1 | 2/2000 | |
| JP | 3559426 B2 | 9/2004 | |
| JP | 2005-203456 A1 | 7/2005 | |
| JP | 2006-080116 A1 | 3/2006 | |
| JP | 2007-084367 A1 | 4/2007 | |
| JP | 2007-300079 A1 | 11/2007 | |
| JP | 2008-115065 A1 | 5/2008 | |
| JP | 2009-292688 A1 | 12/2009 | |

OTHER PUBLICATIONS

Weiss et al. The System Al-Mg-O-N. Communications of the American Ceramic Society. May 1982, p. C-68 to C-69.*
International Search Report and Written Opinion dated Nov. 15, 2011 (with English translation).
U.S. Appl. No. 13/478,508, filed May 23, 2012, Watanabe et al.
J. Weiss et al., "*The System Al-Mg-O-N*," Communications of the American Ceramic Society, vol. 65, May 1982, C68-C69.
U.S. Office Action (U.S. Appl. No. 13/478,508) dated Mar. 15, 2013.
U.S. Appl. No. 13/863,729, filed Apr. 16, 2013, Kondo et al.
U.S. Appl. No. 13/863,803, filed Apr. 16, 2013, Kondo et al.
U.S. Appl. No. 13/864,467, filed Apr. 17, 2013, Aikawa et al.
U.S. Appl. No. 13/864,559, filed Apr. 17, 2013, Kondo et al.
U.S. Appl. No. 13/869,285, filed Apr. 24, 2013, Aikawa et al.

* cited by examiner

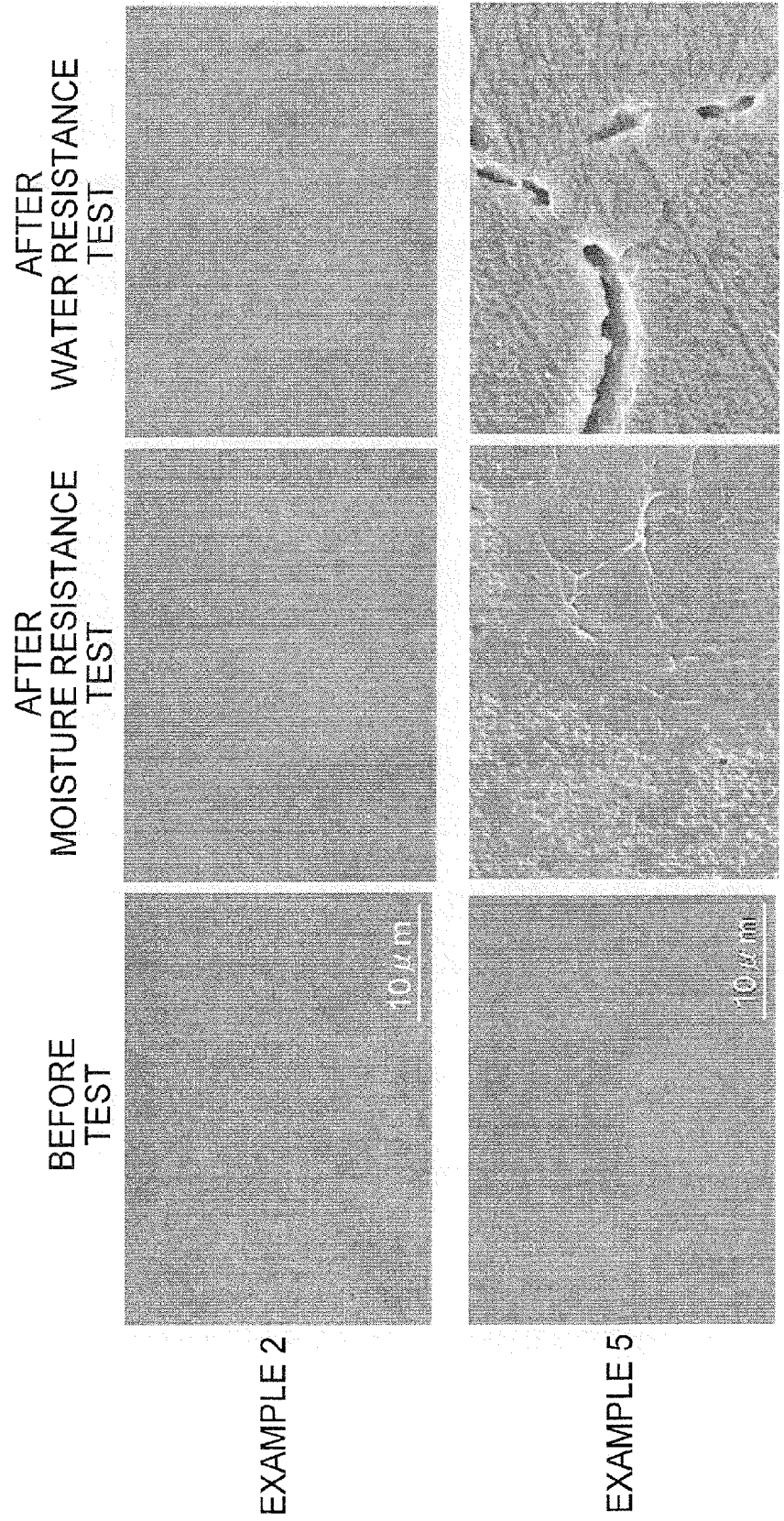

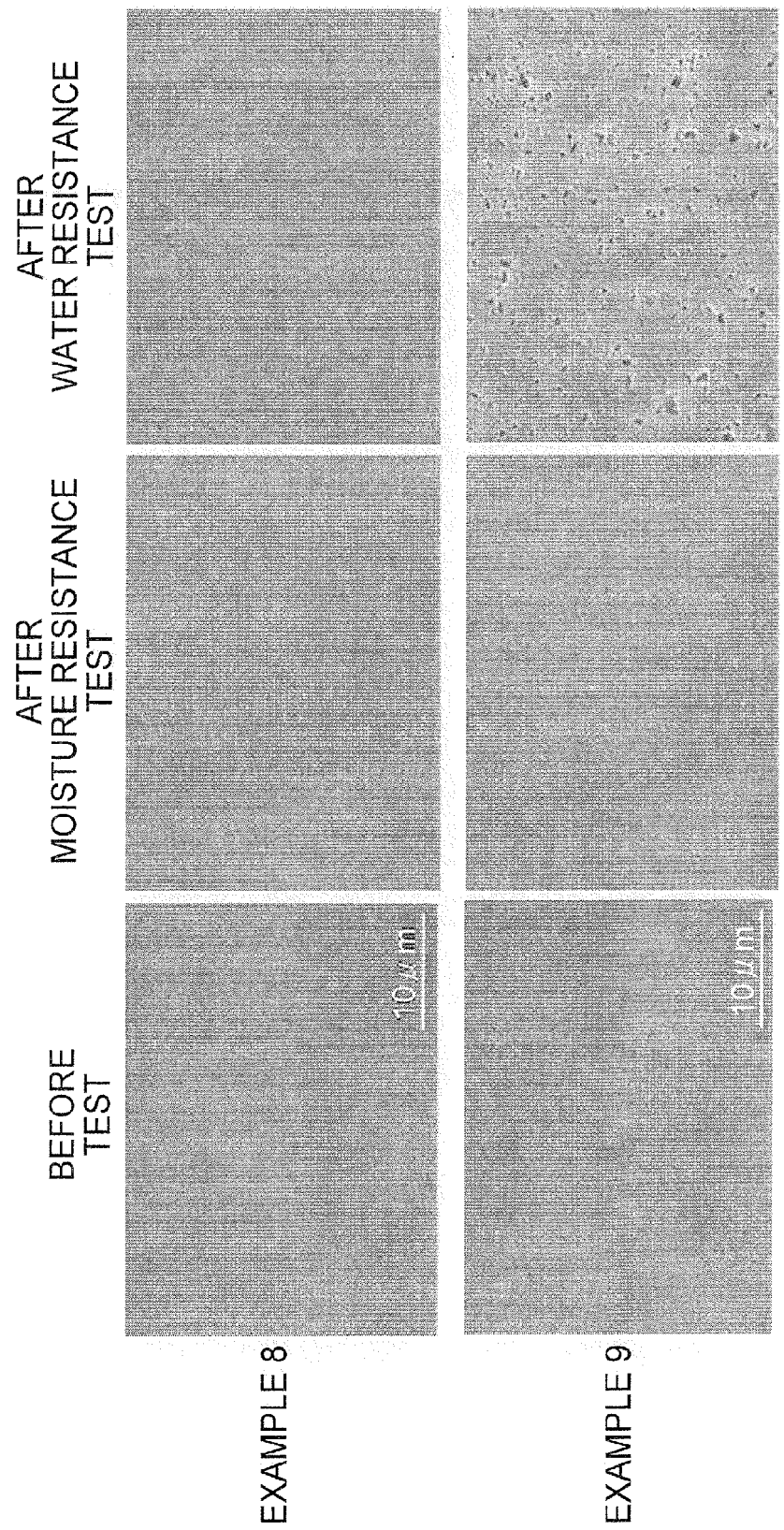

CERAMIC MATERIAL, MEMBER FOR SEMICONDUCTOR MANUFACTURING EQUIPMENT, SPUTTERING TARGET MEMBER AND METHOD FOR PRODUCING CERAMIC MATERIAL

BACKGROUND OF THE INVENTION

1. Field of the Invention

The present invention relates to a ceramic material, a member for use in semiconductor manufacturing equipment, a sputtering target member, and a method for producing a ceramic material.

2. Description of the Related Art

In semiconductor manufacturing equipment used for dry processes, plasma coating, and so forth in semiconductor manufacturing, a high-reactivity halogen (e.g., F or Cl)-based plasma is used for etching and cleaning. Thus, members used in the semiconductor manufacturing equipment are required to have high corrosion resistance. In general, high-corrosion resistant metals, such as anodized aluminum and Hastelloy, and ceramic members are used. In particular, materials for electrostatic chucks, which support Si wafers, and heaters are required to have high corrosion resistance and low particle emission properties. Thus, high-corrosion resistant ceramic members composed of, for example, aluminum nitride, alumina, sapphire, are used. Long-term use of these materials causes them to corrode gradually, so that particles can be emitted. Thus, a higher corrosion resistant material is required. Magnesium oxide and spinel, which are magnesium compounds, are known to have high corrosion resistance against halogen-based plasma, compared with alumina-based materials. In particular, it is reported that a higher magnesium oxide content results in higher corrosion resistance (for example, PTL 1).

Furthermore, magnesium oxide is used for refractory materials, various additives, electronic components, phosphor materials, various target materials, underlying materials for superconducting thin films, tunnel barriers of magnetic tunnel junction devices (MTJ devices), protective films for color plasma displays (PDPs), and used as a raw material for crystalline magnesium oxide layers for PDPs. Thus, magnesium oxide has been attracting attention as a material having a very wide range of applications. In particular, magnesium oxide is used as a sputtering target material to produce tunnel barriers of MTJ devices using the tunneling magnetoresistive effect and protective films for dielectrics and electrodes of PDPs. In a MTJ device including a very thin insulator, which has a thickness of several nanometers, interposed between two magnetic layers, the electrical resistance of the device is different between when relative magnetization directions of the two magnetic layers are parallel to each other and when they are antiparallel to each other. The electrical resistance change phenomenon is referred to as the tunneling magnetoresistive effect. The utilization of the electrical resistance change in the magnetized state enables the device to be applied to, for example, magnetic heads of hard disks. PTLs 2 and 3, which are described below, are related to magnesium oxide.

[Patent Document 1] JP 3559426 B
[Patent Document 2] JP 2009-292688 A
[Patent Document 3] JP 2006-80116 A

SUMMARY OF THE INVENTION

However, magnesium oxide reacts with moisture and carbon dioxide in air to form hydroxide and carbonate. Thus, the surface of magnesium oxide is gradually altered (problem of moisture resistance). In the case where magnesium oxide is used for a member for semiconductor manufacturing equipment, hydroxide and carbonate are disadvantageously decomposed to form gases, so that magnesium oxide is formed into particles, thereby emitting particles to contaminate a semiconductor device. Thus, application of magnesium oxide has been limited. To improve moisture resistance, there is a method in which NiO, ZnO, and so forth form a solid solution with magnesium oxide (PTL 2). These metal components, however, serve as contaminants that affect the properties of a semiconductor device. Thus, these metal components are not preferred as additives.

The present invention has been made to overcome the foregoing problems. It is a main object of the present invention to provide a ceramic material having a corrosion resistance comparable to magnesium oxide and having superior moisture resistance and water resistance to magnesium oxide.

In recent years, magnetoresistive random access memories (hereinafter, also referred to as "MRAMs") using MTJ devices described above have been studied (for example, PTL 3). MRAMs include, for example, a large number of MTJ devices arranged, magnetization arrangements serving as information carriers. MRAMs have features, such as nonvolatility, high speed, and high rewrite durability. Thus, there have been advances in the development of MRAMs as memories that exceed conventional semiconductor memories (DRAMs). In the past, prototype memories each having a storage capacity of several to several tens of megabits (Mbit) have been made. For example, in order to replace DRAMs, it is necessary to further increase the capacity to a gigabit (Gbit) class capacity.

Hitherto, as a material for a tunnel barrier of a MTJ device, single-crystal or high-pure magnesium oxide have been commonly used. It has been common to form a tunnel barrier using a sputtering target material of magnesium oxide. However, to further increase the capacity, the MTJ device is required to have a low electrical resistance and high magnetoresistance ratio for providing a higher output signal.

The present invention has been made to overcome the foregoing problems. It is another object of the present invention to provide a sputtering target having a lower electrical resistance than magnesium oxide. The use of the target for the production of a magnetic tunnel junction device should result in a reduction in electrical resistance.

The inventors have conducted intensive studies on the corrosion resistance of a ceramic material formed by compacting a mixed powder of magnesium oxide, alumina, and aluminum nitride and subjecting the resulting compact to hot-press sintering and have found that a ceramic material having a crystal phase of a MgO—AlN solid solution in which aluminum and nitrogen components are dissolved in magnesium oxide, the crystal phase serving as a main phase, is excellent in corrosion resistance, moisture resistance, and water resistance. These findings have led to the completion of the present invention.

That is, a ceramic material of the present invention mainly contains magnesium, aluminum, oxygen, and nitrogen, in which aluminum and nitrogen components are dissolved in magnesium oxide, the crystal phase serving as a main phase. In the present invention, a material in which aluminum and nitrogen components are dissolved in the crystal lattice of magnesium oxide is referred to as the MgO—AlN solid solution.

A member for use in semiconductor manufacturing equipment of the present invention is composed of the ceramic material.

A sputtering target member of the present invention is composed of the ceramic material.

A method for producing the ceramic material of the present invention includes a step of subjecting a mixed powder of magnesium oxide, aluminum oxide, and aluminum nitride to hot-press sintering in an inert atmosphere to produce the ceramic material.

The ceramic material of the present invention has corrosion resistance comparable to magnesium oxide and has superior moisture resistance and water resistance to magnesium oxide. Thus, a member composed of the ceramic material for semiconductor manufacturing equipment can withstand a high-reactive halogen (e.g., F or Cl)-based plasma used in a semiconductor fabrication process for prolonged periods of time and can reduce the amount of particles emitted from the member. Furthermore, the member has high moisture resistance and water resistance and is not easily altered, compared with common magnesium oxide. Thus, the member can be wet-processed.

The ceramic material of the present invention maintains the crystal structure of magnesium oxide and has a lower electrical resistance than magnesium oxide. This is presumably because aluminum and nitrogen form a solid solution with crystalline magnesium oxide, thereby increasing the number of carriers in magnesium oxide. Thus, when a sputtering target member composed of the ceramic material is used to produce, for example, a tunnel barrier of a magnetic tunnel junction device, the resulting magnetic tunnel junction device should have a lower electrical resistance than magnesium oxide, in which the tunnel barrier containing magnesium, aluminum, oxygen, and nitrogen. Furthermore, aluminum and nitrogen are dissolved in the solid solution to form impurity levels in the band gap of magnesium oxide. This should provide the effect of, for example, reducing the height of the tunnel barrier. Moreover, it is possible to provide a magnetic tunnel junction device having a high magnetoresistance ratio. In addition, aluminum and nitrogen are dissolved in the solid solution, thereby changing the lattice constant of magnesium oxide. Thus, the lattice constant can be adjusted by changing the solid solubility, thereby adjusting the lattice matching with a material on which a film is to be formed.

As described above, the ceramic material has higher moisture resistance than common magnesium oxide and thus is not easily altered. When the ceramic material is transferred and handled in air, hydroxide and carbonate are not easily formed on the surface. It is thus possible to reduce contamination with gas components formed by the decomposition of hydroxide and carbonate at the time of, for example, sputtering for the production of a MTJ device. Furthermore, it is possible to reduce the effect on a material on which a film is to be formed. Thereby, a magnetic tunnel junction device having higher performance should be provided.

BRIEF DESCRIPTION OF DRAWINGS

FIG. 4 illustrates photographs of microstructures of bulk materials in Experimental Examples 2 and 5 before and after a moisture resistance test and a water resistance test.

FIG. 5 illustrates photographs of microstructures of bulk materials in Experimental Examples 8 and 9 before and after the moisture resistance test and the water resistance test.

DETAILED DESCRIPTION OF THE INVENTION

Figure 1:
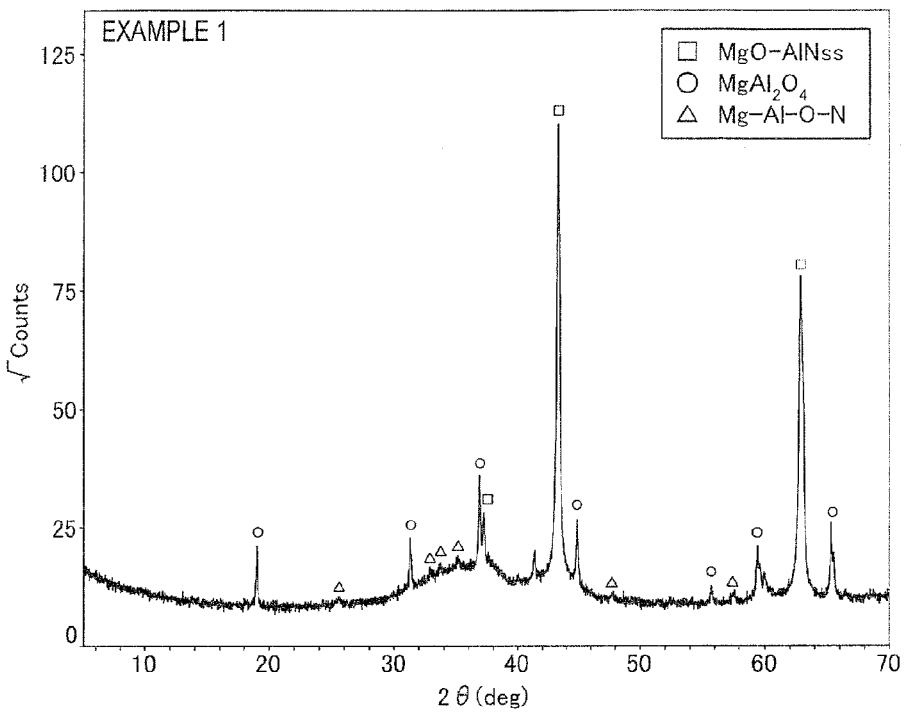
FIG. 1 is an X-ray diffraction (XRD) analysis chart in Experimental Example 1.

A ceramic material of the present invention is a ceramic material mainly containing magnesium, aluminum, oxygen, and nitrogen and has a crystal phase of a MgO—AlN solid solution in which an aluminum nitride component is dissolved in magnesium oxide, the crystal phase serving as a main phase. It is thought that the MgO—AlN solid solution has corrosion resistance comparable to that of magnesium oxide and has moisture resistance and water resistance superior to those of magnesium oxide. Thus, it is thought that the ceramic material having the crystal phase of the MgO—AlN solid solution as a main phase has high corrosion resistance, moisture resistance, and water resistance. In the ceramic material of the present invention, it is possible to significantly increase the solid solubility of aluminum and nitrogen components by the addition of aluminum nitride and aluminum oxide to magnesium oxide. Thus, the MgO—AlN solid solution may contain aluminum in an amount larger than the amount of nitrogen dissolved in the solid solution.

Preferably, XRD peaks corresponding to the (111), (200), (220) planes of the MgO—AlN solid solution measured with CuKα radiation appear at 2θ=36.9 to 39°, 42.9 to 44.8°, and 62.3 to 65.2°, respectively, the XRD peaks being located between peaks of cubic magnesium oxide and peaks of cubic aluminum nitride. Alternatively, XRD peaks corresponding to the (200) and (220) planes of the MgO—AlN solid solution measured with CuKα radiation may appear at 2θ=42.9 to 44.8° and 62.3 to 65.2°, respectively, the XRD peaks being located between peaks of cubic magnesium oxide and peaks of cubic aluminum nitride. Furthermore, the XRD peak corresponding to the (111) plane may appear at 2θ=36.9 to 39°, the XRD peak being located between a peak of cubic magnesium oxide and a peak of cubic aluminum nitride. The peak corresponding to the (111) plane is not clearly distinguished from peaks corresponding to other crystal phases, in some cases. For this reason, only the XRD peaks corresponding to the (200) and (220) planes may appear in the ranges described above. Similarly, the peak corresponding to the (200) or (220) plane is not clearly distinguished from peaks corresponding to other crystal phases, in some cases. A higher solid solubility of aluminum and nitrogen components results in improvements in moisture resistance and water resistance. The XRD peaks of magnesium oxide shift to higher angles with increasing solid solubility. Thus, when the XRD peaks corresponding to the (200) and (220) planes of the MgO—AlN solid solution appear at 2θ=42.92° or more and 62.33° or more, respectively, the moisture resistance can be enhanced, which is more preferred. When the XRD peaks corresponding to the (200) and (220) planes of the MgO—AlN solid solution appear at 2θ=42.95° or more and 62.35° or more, respectively, the moisture resistance and the water resistance can be enhanced, which is more preferred. Furthermore, when the XRD peaks corresponding to the (200) and (220) planes of the MgO—AlN solid solution appear at 2θ=43.04° or more and 62.50° or more, respectively, the moisture resistance and the water resistance can be more enhanced, which is preferred. Moreover, when the XRD peaks corresponding to the (200) and (220) planes of the MgO—AlN solid solution appear at 2θ=43.17° or more and 62.72° or more, respectively, the moisture resistance and the water resistance can be still more enhanced, which is more preferred. In addition, it was found that a smaller integral breadth of the MgO—AlN solid solution results in higher water resistance. That is, the integral breadth of the XRD peak corresponding to the (200) plane of the MgO—AlN solid solution is preferably 0.50° or less and more preferably 0.35° or less in order to improve the water resistance.

The ceramic material of the present invention, when an AlN crystal phase is contained as a subphase, tends to have reduced corrosion resistance. Thus, the ceramic material preferably has a lower AlN crystal phase content. More preferably, the ceramic material does not contain the AlN crystal phase.

The ceramic material of the present invention may contain a magnesium-aluminum oxynitride phase as a subphase, in which the XRD peak of the magnesium-aluminum oxynitride phase measured with CuKα radiation appears at least 2θ=47 to 49°. Magnesium-aluminum oxynitride also has high corrosion resistance. Thus, if magnesium-aluminum oxynitride is contained, there is no problem. A higher magnesium-aluminum oxynitride phase content improves the mechanical properties and, in particular, effectively affects improvements in strength and fracture toughness. However, magnesium-aluminum oxynitride has low corrosion resistance, compared with the MgO—AlN solid solution of the present invention. Thus, the proportion of the magnesium-aluminum oxynitride is restricted in view of corrosion resistance. Upon letting the XRD peak intensity of the magnesium-aluminum oxynitride phase observed at 2θ=47 to 49° be A, and letting the intensity of the XRD peak corresponding to the (220) plane of the MgO—AlN solid solution observed at 2θ=62.3 to 65.2° be B, A/B is preferably 0.03 or more. In this case, the mechanical properties can be enhanced. From the viewpoint of corrosion resistance, A/B is preferably 0.14 or less.

In the ceramic material of the present invention, the ratio by mole of magnesium/aluminum in a mixed powder is preferably 0.5 or more.

The ceramic material of the present invention preferably has an open porosity of 5% or less. Here, the open porosity is defined as a value measured by Archimedes' method using pure water as a medium. An open porosity exceeding 5% can result in a reduction in strength and can be liable to cause particle emissions by the shedding of the material itself. Furthermore, for example, dust components are liable to be accumulated in the pores at the time of processing of the material, which is not preferred. The open porosity is preferably as close to zero as possible. Thus, the lower limit is not particularly set.

The ceramic material of the present invention may have a low heterophase content. In the case of the ceramic material having the MgO—AlN solid solution as a main phase, letting the area of the XRD peak of the magnesium-aluminum oxynitride phase observed at 2θ=47 to 49° be a, letting the area of the XRD peak corresponding to the (220) plane of the MgO—AlN solid solution observed at 2θ=62.3 to 65.2° be b, letting the area of the XRD peak corresponding to the (400) plane of spinel ($MgAl_2O_4$) observed at about 2θ=45.0° be c, and letting the area of the XRD peak corresponding to the (002) plane of aluminum nitride (AlN) at about 2θ=36.0° be d, the value of (a+c+d)/(a+b+c+d) is preferably 0.1 or less. A lower value of (a+c+d)/(a+b+c+d) indicates a higher MgO—AlN solid solution content of the ceramic material and a smaller total amount of the magnesium-aluminum oxynitride phase, spinel ($MgAl_2O_4$), aluminum nitride (AlN), and so forth, which can function as heterophases. The ceramic material having a low heterophase content, for example, a ceramic material in which the value of (a+c+d)/(a+b+c+d) is 0.1 or less, is preferably used for a sputtering target member. In the case where the sputtering target member contains a heterophase, sputtering rates of the main phase and the heterophase can be different from each other. A low heterophase content results in further inhibition of a reduction in the uniformity of a film to be formed and results in further inhibition of, for example, dust emission from the sputtering target member. In addition, aluminum and nitrogen are dissolved in the solid solution, thereby changing the lattice constant of magnesium oxide. Thus, the lattice constant can be adjusted by changing the solid solubility, thereby adjusting the lattice matching with a material on which a film is to be formed.

The ceramic material of the present invention may be used for a member for use in semiconductor manufacturing equipment. Examples of the member for use in semiconductor manufacturing equipment include electrostatic chucks, susceptors, heaters, plates, inner wall materials, monitoring windows, microwave-introducing windows, and microwave coupling antennae, which are used in semiconductor manufacturing equipment. They are required to have excellent resistance to corrosion by the plasma of a halogen element-containing corrosive gas. Thus, the ceramic material of the present invention is preferably used therefor.

The ceramic material of the present invention may be used for a sputtering target member. That is, a sputtering target member of the present invention may be composed of a ceramic material mainly containing magnesium, aluminum, oxygen, and nitrogen, the ceramic material having the crystal phase of a MgO—AlN solid solution in which an aluminum nitride component is dissolved in magnesium oxide, the crystal phase serving as a main phase. The ceramic material of the present invention is preferably used for the sputtering target member because the ceramic material maintains the crystal structure of magnesium oxide and has a lower electrical resistance. An example of the sputtering target member is a member used to produce the tunnel barrier of a magnetic tunnel junction device. Aluminum and nitrogen are dissolved in the solid solution to form impurity levels in the band gap of magnesium oxide. This should provide the effect of, for example, reducing the height of the tunnel barrier. In this case, the ceramic material of the present invention is preferably used to produce at least one magnetic tunnel junction device selected from magnetic heads of hard disks and magnetoresistive random access memories. They are required to have low electrical resistances and high magnetoresistance ratios. Thus, the ceramic material of the present invention is preferably used therefor.

The ceramic material of the present invention may be produced by compacting a mixed powder of magnesium oxide, aluminum nitride, and alumina and sintering the resulting compact. The raw material mixed powder preferably contains 49% by mass or more magnesium oxide, aluminum nitride, and alumina (aluminum oxide). From the viewpoint of achieving good corrosion resistance, the mixed powder more preferably contains 70% by mass to 99% by mass magnesium oxide, 0.5% by mass to 25% by mass aluminum nitride, and 0.5% by mass to 25% by mass aluminum oxide. Still more preferably, the mixed powder contains 70% by mass to 90% by mass magnesium oxide, 5% by mass to 25% by mass aluminum nitride, and 5% by mass to 25% by mass aluminum oxide. From the viewpoint of simultaneously achieving good mechanical properties and corrosion resistance, the mixed powder preferably contains 49% by mass to 99% by mass magnesium oxide, 0.5% by mass to 25% by mass aluminum nitride, and 0.5% by mass to 30% by mass aluminum oxide. More preferably, the mixed powder contains 50% by mass to 75% by mass magnesium oxide, 5% by mass to 20% by mass aluminum nitride, and 15% by mass to 30% by mass aluminum oxide. The sintering temperature is preferably 1650° C. or higher and more preferably 1700° C. or higher. A sintering temperature of less than 1650° C. can fail to provide the target MgO—AlN solid solution and thus is not preferred. At a sintering temperature of less than 1700° C., AlN can be contained as a subphase. To achieve high corrosion resistance, sintering is preferably performed at 1700° C. or higher. The upper limit of the sintering temperature is not particularly limited and may be, for example, 1850° C. As the sintering, hot-press sintering is preferably employed. The hot-press sintering is preferably performed at a pressing pressure of 50 to 300 kgf/cm². An atmosphere during sintering is preferably an atmosphere that does not affect the sintering of the oxide raw materials. Preferred examples thereof include a nitrogen atmosphere and inert atmospheres, such as an argon atmosphere and a helium atmosphere. The pressure during the compacting is not particularly limited and may be appropriately set to a pressure such that the shape is maintained.

EXAMPLES

Preferred application examples of the present invention will be described below. In Experimental Examples 1 to 16, as raw material MgO, raw material $Al_2O_3$, and raw material AlN, commercial items each having a purity of 99.9% by mass or more and an average particle size of 1 μm or less were used. In Experimental Examples 17 to 28, a commercial item having a purity of 99.4% by mass and an average particle size of 3 μm was used as raw material MgO, a commercial item having a purity of 99.9% by mass and an average particle size of 0.5 μm was used as raw material $Al_2O_3$, and a commercial item, having an average particle size of 1 μm or less, the same as that used in Experimental Examples 1 to 16 was used as raw material AlN. Here, with respect to raw material AlN, an oxygen contamination of about 1% by mass is inevitable. Thus, the foregoing purity is a value of impurity elements excluding oxygen. Experimental Examples 1 to 4, 7 to 17, 21, and 23 to 28 correspond to examples of the present invention. Experimental Examples 5 to 6, 18 to 20, and 22 correspond to comparative examples.

Experimental Examples 1 to 3

Preparation

Raw material MgO, raw material $Al_2O_3$, and raw material AlN were weighed in amounts (% by mass) described in Table 1. These materials were wet-mixed for 4 hours in a nylon pot with alumina balls each having a diameter of 5 mm using isopropyl alcohol as a solvent. After the completion of the mixing, the resulting slurry was taken out and dried at 110° C. in a stream of nitrogen. Then the mixture was passed through a 30-mesh sieve to provide a mixed powder. The ratio by mole of Mg/Al of the mixed powder was 2.9.

Compacting

The mixed powder was subjected to uniaxial pressing at 200 kgf/cm² to form a disk-like formed article having a diameter of about 35 mm and a thickness of about 10 mm. The formed article was accommodated in a graphite mold for sintering.

Sintering

The disk-like formed article was subjected to hot-press sintering to provide a ceramic material. The hot-press sintering was performed at a pressing pressure of 200 kgf/cm² and a sintering temperature (maximum temperature) described in Table 1. An Ar atmosphere was maintained until the sintering was completed. The holding time at the sintering temperature was 4 hours.

Experimental Example 4

A ceramic material was prepared as in Experimental Example 1, except that the sintering temperature was 1650° C.

Experimental Example 5

A ceramic material was prepared as in Experimental Example 1, except that only raw material MgO was used and that the sintering temperature was 1500° C.

Experimental Example 6

A ceramic material was prepared as in Experimental Example 1, except that raw material MgO and raw material $Al_2O_3$ were weighed in amounts (% by mass) described in Table 1 and that the sintering temperature was 1650° C.

Experimental Examples 7 to 16

Ceramic materials were each prepared as in Experimental Example 1, except that raw material MgO, raw material $Al_2O_3$, and raw material AlN were weighed in amounts (% by mass) described in Table 1 and that the sintering temperature (maximum temperature) was set to a value described in Table 1.

Experimental Examples 17 to 21

Ceramic materials were each prepared as in Experimental Example 1, except that raw material MgO, raw material $Al_2O_3$, and raw material AlN were weighed in amounts (% by mass) described in Table 3, the compacting pressure applied to the mixed powder was 100 kgf/cm², the diameter of the resulting sample was 50 mm, the atmosphere during the sintering was $N_2$, and the sintering temperature (maximum temperature) was set to a value described in Table 3.

Experimental Example 22

A preparation step was performed as that in Experimental Example 1, except that raw material MgO and raw material $Al_2O_3$ were weighed in amounts (% by mass) described in Table 3, thereby providing a mixed powder. The mixed powder was subjected to uniaxial pressing at 100 kgf/cm² to form a columnar formed article having a diameter of 20 mm and a thickness of 15 mm. A compacting step of subjecting the resulting formed article to cold isostatic pressing (CIP) at 3000 kgf/cm² was performed. The foregoing raw material mixture was charged into a graphite crucible with a lid. The formed article was embedded in the charged raw material mixture. A normal pressure sintering of the columnar formed article was performed to provide a ceramic material. In the sintering step, sintering was performed at a sintering temperature (maximum temperature) described in Table 3. An Ar atmosphere was maintained until the sintering was completed. The holding time at the sintering temperature was 4 hours.

Experimental Examples 23 to 28

Ceramic materials were each prepared as in Experimental Example 1, except that raw materials of MgO, $Al_2O_3$, and AlN were weighed in amounts (% by mass) described in Table 3, iron-core nylon balls each having a diameter of 20 mm were used as the balls in the preparation, a disk-like formed article having a diameter of about 50 mm and a thickness of about 20 mm was formed by performing the uniaxial pressing at a compacting pressure of 100 kgf/cm$^2$, the sintering temperature (maximum temperature) was set to a value described in Table 3, and the atmosphere during the sintering was N$_2$.

Evaluation

Each of the materials produced in Experimental Examples 1 to 28 was processed for various evaluations, and the following evaluations were made. Tables 1 to 4 show the evaluation results. In Experimental Examples 1 to 17, samples each having a diameter of 50 mm were produced. The evaluation results of these samples were the same as those described in Tables 1 to 4.

(1) Bulk Density and Open Porosity

The bulk density and open porosity were measured by Archimedes' method using pure water as a medium.

(2) Crystal Phase Evaluation

Each of the materials was pulverized with a mortar. The crystal phase was identified with an X-ray diffractometer. The measurement was performed with a sealed tube-type X-ray diffractometer (D8 ADVANCE, manufactured by Bruker AXS) operating at 40 kV and 40 mA and using CuKα radiation in the range of 2θ between 5° and 70° with a step size of 0.02°. In the case where diffraction angles at positions of the peak maxima were determined, 10% by mass of a standard Si sample powder (SRM 640C) manufactured by National institute of Standards and Technology (NIST) was added as an internal standard to correct peak positions. The diffraction angles at the positions of the peak maxima of magnesium oxide were defined as values reported in International Centre for Diffraction Data (ICDD) card No. 78-0430. The peak spacing and the integral breadth between the MgO—AlN solid solution and magnesium oxide were calculated as described below.

(2)-1 Calculation of Peak Spacing (Peak Shift)

To perform the relative comparison of the solid solubility of Al and N in the MgO—AlN solid solution, the peak spacing (peak shift) was evaluated with reference to the (220) plane of the MgO—AlN solid solution. The difference between the diffraction angle at the position of the peak maximum corresponding to the (220) plane of the MgO—AlN solid solution and the diffraction angle (62.3° of the (220) plane of magnesium oxide reported in ICDD card No. 78-0430 was defined as the peak spacing.

(2)-2 Calculation of Integral Breadth

To perform the relative comparison of the crystallinity of the MgO—AlN solid solution, the integral breadth was calculated. The integral breadth was calculated by dividing the peak area of the (200) peak of the MgO—AlN solid solution by the intensity of the peak maximum (Imax). The peak area was obtained by cancelling the background and integrating the intensity in the range of −1° to +1° of the diffraction angle at the position of the peak maximum. The calculation formula is described below. The background was defined as a peak intensity at an angle obtained by subtracting 1° from the diffraction angle at the position of the peak maximum. The integral breadth of the (111) plane of the standard Si sample (SRM 640C) manufactured by NIST was calculated by the method and found to be 0.15°. (Integral Breadth)=(ΣI(2θ)× (step size))/Imax (2)-3 Calculation of XRD Peak Intensity Ratio of Magnesium-Aluminum Oxynitride Phase and MgO—AlN Solid Solution To perform the relative comparison of the proportion of the magnesium-aluminum oxynitride phase contained as a subphase, the XRD peak intensity ratio of the magnesium-aluminum oxynitride phase to the MgO—AlN solid solution was calculated by a method described below. Upon letting the XRD peak intensity of the magnesium-aluminum oxynitride phase observed at 2θ=47 to 49° be A, and letting the intensity of the XRD peak corresponding to the (220) plane of the MgO—AlN solid solution observed at 2θ=62.3 to 65.2° be B, the value of A/B was determined. Here, the XRD peak intensity A was defined as an integrated intensity obtained by cancelling the background of the XRD peak observed at 2θ=47 to 49°. The XRD peak intensity B was defined as an integrated intensity obtained by cancelling the background of the XRD peak corresponding to the (220) plane of the MgO—AlN solid solution. The calculation was performed with commercially available software JADE 5 manufactured by Materials Data Incorporated (MDI).

(2)-4 Calculation of Heterophase Content

To perform the relative comparison of the heterophase content of the entire ceramic material, the XRD peak area ratio was calculated by a method described below. Upon letting the area of the XRD peak of the magnesium-aluminum oxynitride phase observed at 2θ=47 to 49° be a, letting the area of the XRD peak corresponding to the (220) plane of the MgO—AlN solid solution observed at 2θ=62.3 to 65.2° be b, letting the area of the XRD peak corresponding to the (400) plane of spinel (MgAl$_2$O$_4$) observed at about 2θ=45.0° be c, and letting the area of the XRD peak corresponding to the (002) plane of aluminum nitride (AlN) at about 2θ=36.0° be d, the value of (a+c+d)/(a+b+c+d) was determined. Here, the XRD peak areas a, b, c, and d were defined as respective peak areas determined by means of the peak search function of commercially available software JADE 5 (manufactured by MDI) at the corresponding angles described above. In JADE 5, peak search parameters were set as follows: Type of filter: Parabolic Filter, and Definition of peak location: Summit. The threshold and range were set as follows: Threshold σ=3.00, Peak intensity (%) cutoff=0.1, Range to find BG=1.0, Points to average BG=7, Angular range=5.0 to 70.0°, Length of variable filter (data points): ON, Removal of Kα2 peak: ON, and Removal of existing peak list: ON. Furthermore, the ratio of the peak area a to the peak area b, i.e., a/b, was determined using the calculation method described above.

(3) Etch Rate

A surface of each of the materials was mirror-polished. A corrosion resistance test was performed with an inductively coupled plasma (ICP) corrosion resistance testing apparatus under conditions described below. The step height between a masked surface and an exposed surface measured with a surface profiler was divided by a testing time to calculate the etch rate of each material.

ICP: 800 W, Bias: 450 W, Introduction gas: NF$_3$/O$_2$/Ar=75/35/100 sccm at 0.05 Torr, Exposure time: 10 h, Sample temperature: room temperature.

(4) Constituent Elements

The detection, identification, and concentrations of constituent elements were analyzed by electron probe microanalysis (EPMA).

(5) Moisture Resistance

Each of the materials was pulverized with a mortar to prepare a powder having a median diameter of 10 μm or less. The powder was exposed to an atmosphere with a saturated water vapor pressure at room temperature for 4 days. Then the amount of dehydration was measured with a thermogravimetry (TG) and differential thermal analyzer (DTA) in the temperature range of 40° C. to 500° C.

(6) Moisture Resistance of Bulk Material

A surface of each of the materials was mirror-polished. The mirror-polished materials were exposed to an atmosphere having a temperature of 40° C. and a relative humidity of 90% for 28 days. Then the surface of each material was observed with a scanning electron microscope (XL30, manufactured by Philips). Evaluation criteria are described below:
(○) Unchanged;
(x) Acicular or granular deposits were formed on 40% or more of the surface; and
(Δ) Intermediate therebetween.

(7) Water Resistance of Bulk Material

A surface of each of the materials was mirror-polished. The mirror-polished materials were immersed in water at room temperature for 15 days. Then the surface of each material was observed with the scanning electron microscope. Evaluation criteria are described below:
(○) Unchanged;
(x) The trace of elution was observed on 40% or more of the surface; and
(Δ) Intermediate therebetween.

(8) Fracture Toughness

The fracture toughness was evaluated by a single edge precracked beam (SEPB) method according to JIS-R1607.

(9) Bending Strength

The bending strength was measured by a bending strength test according to JIS-R1601.

(10) Measurement of Volume Resistivity

The volume resistivity was measured by a method according to JIS-C2141 in air at room temperature. A test piece had a size of 50 mm×(0.5 to 1 mm). Electrodes composed of silver were formed in such a manner that a main electrode had a diameter of 20 mm, a guard electrode had an inside diameter of 30 mm and an outside diameter of 40 mm, and an application electrode had a diameter of 40 mm. The applied voltage was 2 kV/mm. A current value one minute after the application of the voltage was read. The volume resistivity at room temperature was calculated from the current value.

In each of Experimental Examples 1, 3, 5, 12, and 23 to 28, the volume resistivity was measured by the same method in vacuum (0.01 Pa or less) at 600° C. A test piece had a size of 50 mm×(0.5 to 1 mm). Electrodes composed of silver were formed in such a manner that a main electrode had a diameter of 20 mm, a guard electrode had an inside diameter of 30 mm and an outside diameter of 40 mm, and an application electrode had a diameter of 40 mm. The applied voltage was 500 V/mm. A current value one hour after the application the voltage was read. The volume resistivity at room temperature was calculated from the current value. In the volume resistivity described in Tables 2 and 4, "aEb" represents $a \times 10^b$. For example, "1E16" represents $1 \times 10^{16}$.

TABLE 1

| Composition | MgO (Mass %) | $Al_2O_3$ (Mass %) | AlN (Mass %) | Mg/Al Molar Ratio | Sintering Temperature (° C.) | Bulk Density (g/cm$^3$) | Open Porosity (%) |
|---|---|---|---|---|---|---|---|
| Experimental Example 1 | 70.7 | 22.0 | 7.2 | 2.9 | 1850 | 3.53 | 0.15 |
| Experimental Example 2 | 70.7 | 22.0 | 7.2 | 2.9 | 1800 | 3.54 | 0.04 |
| Experimental Example 3 | 70.7 | 22.0 | 7.2 | 2.9 | 1750 | 3.54 | 0.04 |
| Experimental Example 4 | 70.7 | 22.0 | 7.2 | 2.9 | 1650 | 3.53 | 0.10 |
| Experimental Example 5 | 100 | — | — | — | 1500 | 3.57 | 0.30 |
| Experimental Example 6 | 37.0 | 63.0 | — | 0.7 | 1650 | 3.57 | 0.00 |
| Experimental Example 7 | 60.7 | 29.6 | 9.7 | 1.9 | 1850 | 3.52 | 0.05 |
| Experimental Example 8 | 60.7 | 29.6 | 9.7 | 1.9 | 1800 | 3.52 | 0.05 |
| Experimental Example 9 | 60.7 | 29.6 | 9.7 | 1.9 | 1750 | 3.52 | 0.05 |
| Experimental Example 10 | 61.2 | 25.2 | 13.5 | 1.9 | 1800 | 3.49 | 0.02 |
| Experimental Example 11 | 66.2 | 24.1 | 9.7 | 2.3 | 1800 | 3.52 | 0.01 |
| Experimental Example 12 | 71.2 | 18.8 | 10.1 | 2.9 | 1800 | 3.52 | 0.03 |
| Experimental Example 13 | 56.1 | 28.6 | 15.3 | 1.5 | 1800 | 3.47 | 0.05 |
| Experimental Example 14 | 85.0 | 11.3 | 3.7 | 10.6 | 1800 | 3.55 | 0.07 |
| Experimental Example 15 | 72.6 | 9.3 | 18.2 | 2.9 | 1800 | 3.46 | 0.00 |
| Experimental Example 16 | 74.0 | 24.7 | 1.3 | 3.6 | 1800 | 3.56 | 0.19 |

| Composition | Crystal Phase Main Phase[1] | Crystal Phase Subphase[2] | MgO—AlNss Peak Maximum (111) Plane (°) | MgO—AlNss Peak Maximum (200) Plane (°) | MgO—AlNss Peak Maximum (220) Plane (°) | (220) Plane XRD Peak Shift[3] (°) | (200) Integral Breadth[4] (°) |
|---|---|---|---|---|---|---|---|
| Experimental Example 1 | MgO—AlNss | $MgAl_2O_4$ Mg—Al—O—N | 37.22 | 43.26 | 62.85 | 0.55 | 0.26 |
| Experimental Example 2 | MgO—AlNss | $MgAl_2O_4$ Mg—Al—O—N | 37.14 | 43.18 | 62.73 | 0.43 | 0.25 |

TABLE 1-continued

| | Composition | | | | | |
|---|---|---|---|---|---|---|
| Experimental Example 3 | MgO—AlNss | MgAl₂O₄ Mg—Al—O—N | 36.96 | 43.16 | 62.75 | 0.45 | 0.45 |
| Experimental Example 4 | MgO—AlNss | MgAl₂O₄, AlN | 36.94 | 42.92 | 62.33 | 0.03 | 0.34 |
| Experimental Example 5 | MgO | — | 36.90 | 42.90 | 62.30 | 0.00 | 0.28 |
| Experimental Example 6 | MgAl₂O₄ | MgO | — | 42.90 | 62.30 | 0.00 | 0.27 |
| Experimental Example 7 | MgO—AlNss | MgAl₂O₄ Mg—Al—O—N | — | 43.18 | 62.73 | 0.43 | 0.26 |
| Experimental Example 8 | MgO—AlNss | MgAl₂O₄ Mg—Al—O—N | — | 43.18 | 62.73 | 0.43 | 0.32 |
| Experimental Example 9 | MgO—AlNss | MgAl₂O₄ Mg—Al—O—N | — | 43.04 | 62.65 | 0.35 | 0.49 |
| Experimental Example 10 | MgO—AlNss | MgAl₂O₄ Mg—Al—O—N | — | 43.20 | 62.75 | 0.45 | 0.31 |
| Experimental Example 11 | MgO—AlNss | MgAl₂O₄ Mg—Al—O—N | — | 43.20 | 62.75 | 0.45 | 0.28 |
| Experimental Example 12 | MgO—AlNss | Mg—Al—O—N | 37.24 | 43.26 | 62.83 | 0.53 | 0.30 |
| Experimental Example 13 | MgO—AlNss | MgAl₂O₄ Mg—Al—O—N | — | 43.18 | 62.73 | 0.43 | 0.30 |
| Experimental Example 14 | MgO—AlNss | MgAl₂O₄ Mg—Al—O—N | 37.06 | 43.08 | 62.53 | 0.23 | 0.25 |
| Experimental Example 15 | MgO—AlNss | Mg—Al—O—N | 36.98 | 42.98 | 62.41 | 0.11 | 0.27 |
| Experimental Example 16 | MgO—AlNss | MgAl₂O₄ | — | 42.94 | 62.37 | 0.07 | 0.25 |

[1] MgO—AlNss: MgO—AlN Solid Solution (Cubic)
[2] Mg—Al—O—N: Mg, Al Oxynitride
[3] XRD Peak Spacing of MgO—AlNss (220) Plane and MgO (220) Plane
[4] Integral Breadth Between MgO—AlNss (200) Plane

TABLE 2

| Composition | XRD Peak A/B[1] | XRD Peak[2] a/b | XRD Peak[2] (a + c + d)/ (a + b + c + d) | Etch Rate (nm/h) | Rate of Water Loss (%) | Moisture Resistance of Bulk Material[3] | Water Resistance of Bulk Material[4] | Fracture Toughness[5] | Strength (MPa) | Volume Resistivity ($\Omega \cdot cm$) | Volume Resistivity at 600° C. ($\Omega \cdot cm$) |
|---|---|---|---|---|---|---|---|---|---|---|---|
| Experimental Example 1 | 0.004 | <0.001 | 0.052 | 109 | 1.8 | ○ | ○ | — | 65 | — | 8E9 |
| Experimental Example 2 | 0.004 | <0.001 | 0.081 | 112 | 1.9 | ○ | ○ | 2.2 | 145 | >1E17 | — |
| Experimental Example 3 | 0.003 | <0.001 | 0.096 | 110 | 1.9 | ○ | △ | 2 | 171 | >1E17 | 3E10 |
| Experimental Example 4 | 0.000 | 0.000 | 0.483 | 168 | 2.2 | △ | × | — | 275 | — | — |
| Experimental Example 5 | 0.000 | 0.000 | 0.000 | 104 | 6.5 | × | × | 2.2 | 240 | >1E17 | 2E12 |
| Experimental Example 6 | 0.000 | 0.000 | 0.852 | 202 | 2.7 | × | × | — | — | — | — |
| Experimental Example 7 | 0.058 | 0.063 | 0.225 | 142 | 1.6 | ○ | ○ | 2.6 | 204 | — | — |
| Experimental Example 8 | 0.039 | 0.036 | 0.207 | 146 | 1.7 | ○ | ○ | 2.5 | 222 | >1E17 | — |
| Experimental Example 9 | 0.052 | 0.059 | 0.308 | 147 | 1.9 | ○ | △ | 2.5 | 243 | — | — |
| Experimental Example 10 | 0.074 | 0.074 | 0.167 | 138 | 1.8 | ○ | ○ | 2.7 | 204 | >1E17 | — |
| Experimental Example 11 | 0.031 | 0.030 | 0.118 | 143 | 1.8 | ○ | ○ | 2.5 | 183 | — | — |
| Experimental Example 12 | 0.023 | 0.024 | 0.018 | 93 | 1.4 | ○ | ○ | 1.9 | 152 | — | 2E10 |
| Experimental Example 13 | 0.138 | 0.136 | 0.246 | 166 | 1.9 | ○ | ○ | 3.1 | 251 | — | — |
| Experimental Example 14 | 0.005 | 0.006 | 0.027 | 105 | 2.2 | ○ | △ | 2.1 | 177 | — | — |
| Experimental Example 15 | 0.125 | 0.128 | 0.117 | 124 | 2.3 | △ | △ | 4.4 | 350 | >1E17 | — |

TABLE 2-continued

| Composition | XRD Peak A/B[1] | XRD Peak[2] a/b | XRD Peak[2] (a + c + d)/ (a + b + c + d) | Etch Rate (nm/h) | Rate of Water Loss (%) | Moisture Resistance of Bulk Material[3] | Water Resistance of Bulk Material[4] | Fracture Toughness[5] | Strength (MPa) | Volume Resistivity (Ω·cm) | Volume Resistivity at 600° C. (Ω·cm) |
|---|---|---|---|---|---|---|---|---|---|---|---|
| Experimental Example 16 | 0.000 | 0.000 | 0.334 | 104 | 2.3 | Δ | × | 2.2 | 185 | — | — |

[1]A: Peak Intensity of Mg—Al—O—N at 2θ = 47~49°, B: Peak Intensity of MgO at 2θ = 62.3~65.2°
[2]a: XRD Peak Area of Mg—Al—O—N at 2θ = 47~49°
b: XRD Peak Area of MgO—AlNss (220) Plane at 2θ = 62.3~65.2°
c: XRD Peak Area of $MgAl_2O_4$ (400) Plane at about 2θ = 45.0°
d: XRD Peak Area of AlN (002) Plane at about θ = 36.0°
[3]Determined by microstructural change of material mirror-polished and exposed to water-vapor atmosphere of 40° C., 90RH % for 28 days
○: Unchanged, ×: Precipitates on 40% or more of Surface, Δ: Intermediate therebetween
[4]Deteremined by microstructral change of material mirror-polished, immersed in water at RT for 15 days
○: Unchanged, ×: Trace of Elution on 40% or more of Surface, Δ: Intermediate therebetween
[5]Unit of Fracure Toughness: $Mpa \cdot m^{1/2}$
[6]"—" means "Not Measured"

TABLE 3

| Composition | MgO (Mass %) | $Al_2O_3$ (Mass %) | AlN (Mass %) | Mg/Al Molar Ratio | Sintering Temperature (° C.) | Bulk Density (g/cm³) | Open Porosity (%) |
|---|---|---|---|---|---|---|---|
| Experimental Example 17 | 49.0 | 28.2 | 22.8 | 1.1 | 1775 | 3.41 | 0.00 |
| Experimental Example 18 | 70.7 | 22.0 | 7.2 | 2.9 | 1600 | 3.53 | 0.05 |
| Experimental Example 19 | 60.7 | 29.6 | 9.7 | 1.9 | 1600 | 3.54 | 0.07 |
| Experimental Example 20 | 41.0 | 38.4 | 20.6 | 0.8 | 1800 | 3.43 | 0.04 |
| Experimental Example 21 | 60.7 | 29.6 | 9.7 | 1.9 | 1725 | 3.52 | 0.06 |
| Experimental Example 22 | 61.1 | 38.9 | — | 2.0 | 1850 | — | — |
| Experimental Example 23 | 91.8 | 2.8 | 5.3 | 12.3 | 1850 | 3.55 | 0.00 |
| Experimental Example 24 | 91.5 | 4.7 | 3.8 | 12.3 | 1850 | 3.55 | 0.06 |
| Experimental Example 25 | 91.3 | 5.7 | 3.0 | 12.3 | 1850 | 3.55 | 0.00 |
| Experimental Example 26 | 91.1 | 6.6 | 2.3 | 12.3 | 1850 | 3.55 | 0.04 |
| Experimental Example 27 | 91.0 | 7.5 | 1.5 | 12.3 | 1850 | 3.54 | 0.10 |
| Experimental Example 28 | 97.0 | 2.2 | 0.8 | 39.0 | 1850 | 3.55 | 0.04 |

| Composition | Crystal Phase Main Phase[1] | Crystal Phase Subphase[2] | MgO—AlNss Peak Maximum (111) Plane (°) | MgO—AlNss Peak Maximum (200) Plane (°) | MgO—AlNss Peak Maximum (220) Plane (°) | (220) Plane XRD Peak Shift[3] (°) | (200) Integral Breadth[4] (°) |
|---|---|---|---|---|---|---|---|
| Experimental Example 17 | MgO—AlNss | $MgAl_2O_4$, Mg—Al—O—N | — | 43.18 | 62.72 | 0.42 | 0.35 |
| Experimental Example 18 | MgO | $MgAl_2O_4$, AlN | 36.9 | 42.90 | 62.30 | 0.00 | 0.31 |
| Experimental Example 19 | MgO | $MgAl_2O_4$, AlN | — | 42.90 | 62.30 | 0.00 | 0.30 |
| Experimental Example 20 | $MgAl_2O_4$, MgO—AlNss | Mg—Al—O—N | — | 43.17 | 62.72 | 0.42 | 0.27 |
| Experimental Example 21 | MgO—AlNss | $MgAl_2O_4$, Mg—Al—O—N | — | 43.02 | 62.63 | 0.33 | 0.51 |
| Experimental Example 22 | MgO | $MgAl_2O_4$ | — | 42.90 | 62.30 | 0.00 | 0.24 |
| Experimental Example 23 | MgO—AlNss | AlN | 36.98 | 42.98 | 62.38 | 0.08 | 0.23 |
| Experimental Example 24 | MgO—AlNss | Mg—Al—O—N | 37.00 | 43.00 | 62.42 | 0.12 | 0.21 |
| Experimental Example 25 | MgO—AlNss | $MgAl_2O_4$, Mg—Al—O—N | 37.02 | 43.00 | 62.44 | 0.14 | 0.19 |
| Experimental Example 26 | MgO—AlNss | $MgAl_2O_4$, Mg—Al—O—N | 37.04 | 43.04 | 62.50 | 0.20 | 0.18 |

TABLE 3-continued

|  |  |  |  |  |  |  |  |
|---|---|---|---|---|---|---|---|
| Experimental Example 27 | MgO—AlNss | MgAl$_2$O$_4$ | 37.00 | 43.02 | 62.44 | 0.14 | 0.23 |
| Experimental Example 28 | MgO—AlNss | MgAl$_2$O$_4$ | 36.96 | 42.96 | 62.36 | 0.06 | 0.21 |

[1]MgO—AlNss: MgO—AlN Solid Solution (Cubic)
[2]Mg—Al—O—N: Mg, Al Oxynitride
[3]XRD Peak Spacing of MgO—AlNss (220) Plane and MgO (220) Plane
[4]Integral Breadth Between MgO—AlNss (200) Plane

TABLE 4

| Composition | XRD Peak A/B[1] | XRD Peak[2] a/b | XRD Peak[2] (a + c + d)/ (a + b + c + d) | Etch Rate (nm/h) | Rate of Water Loss (%) | Moisture Resistance of Bulk Material[3] | Water Resistance of Bulk Material[4] | Fracture Toughness[5] | Strength (MPa) | Volume Resistivity ($\Omega \cdot cm$) | Volume Resistivity at 600° C. ($\Omega \cdot cm$) |
|---|---|---|---|---|---|---|---|---|---|---|---|
| Experimental Example 17 | 0.321 | 0.322 | 0.362 | 181 | 1.8 | ○ | ○ | 3.2 | 270 | — | — |
| Experimental Example 18 | 0.000 | 0.000 | 0.492 | 171 | 3.6 | × | × | — | — | — | — |
| Experimental Example 19 | 0.000 | 0.000 | 0.352 | 175 | 3.4 | × | × | — | — | — | — |
| Experimental Example 20 | 0.449 | 0.451 | 0.538 | 201 | 1.9 | ○ | ○ | 3.3 | 275 | — | — |
| Experimental Example 21 | 0.058 | 0.059 | 0.351 | 154 | 1.9 | ○ | × | 2.6 | 249 | — | — |
| Experimental Example 22 | 0.000 | 0.000 | 0.491 | — | 3.2 | × | × | — | — | — | — |
| Experimental Example 23 | 0.000 | 0.000 | 0.025 | — | — | Δ | Δ | — | 173 | >1E17 | 1E11 |
| Experimental Example 24 | 0.012 | 0.012 | 0.012 | — | — | Δ | Δ | 2.0 | 140 | — | 9E10 |
| Experimental Example 25 | 0.007 | 0.007 | 0.012 | — | — | Δ | Δ | 2.1 | 180 | — | 9E10 |
| Experimental Example 26 | <0.001 | 0.001 | 0.014 | — | — | ○ | Δ | 2.0 | 150 | >1E17 | 8E10 |
| Experimental Example 27 | 0.000 | 0.000 | 0.069 | — | — | Δ | Δ | 1.9 | 116 | — | 9E10 |
| Experimental Example 28 | 0.000 | 0.000 | 0.019 | — | — | Δ | Δ | 2.0 | 176 | — | 1E11 |

[1]A: Peak Intensity of Mg—Al—O—N at 2θ = 47~49°, B: Peak Intensity of MgO at 2θ = 62.3~65.2°
[2]a: XRD Peak Area of Mg—Al—O—N at 2θ = 47~49°
b: XRD Peak Area of MgO—AlNss (220) Plane at 2θ = 62.3~65.2°
c: XRD Peak Area of MgAl$_2$O$_4$ (400) Plane at about 2θ = 45.0°
d: XRD Peak Area of AlN (002) Plane at about θ = 36.0°
[3]Determined by microstructural change of material mirror-polished and exposed to water-vapor atmosphere of 40° C., 90RH % for 28 days
○: Unchanged, ×: Precipitates on 40% or more of Surface, Δ: Intermediate therebetween
[4]Deteremined by microstructral change of material mirror-polished, immersed in water at RT for 15 days
○: Unchanged, ×: Trace of Elution on 40% or more of Surface, Δ: Intermediate therebetween
[5]Unit of Fracure Toughness: Mpa · m$^{1/2}$
[6]"—" means "Not Measured"

Figure 2:
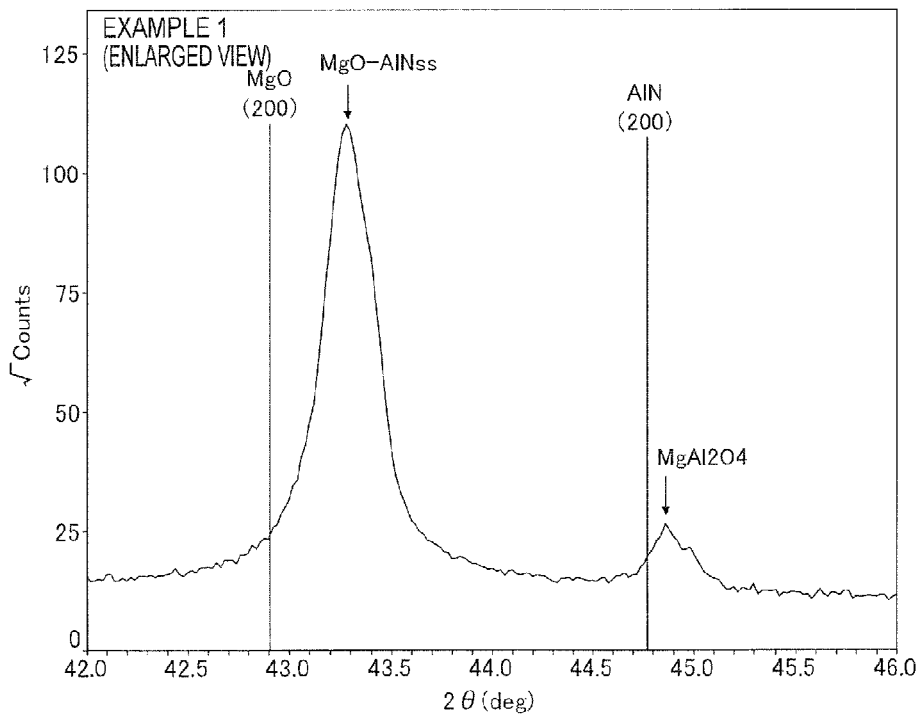
FIG. 2 is an enlarged view of the peak of a MgO—AlN solid solution in the XRD analysis chart in Experimental Example 1.
Figure 3:
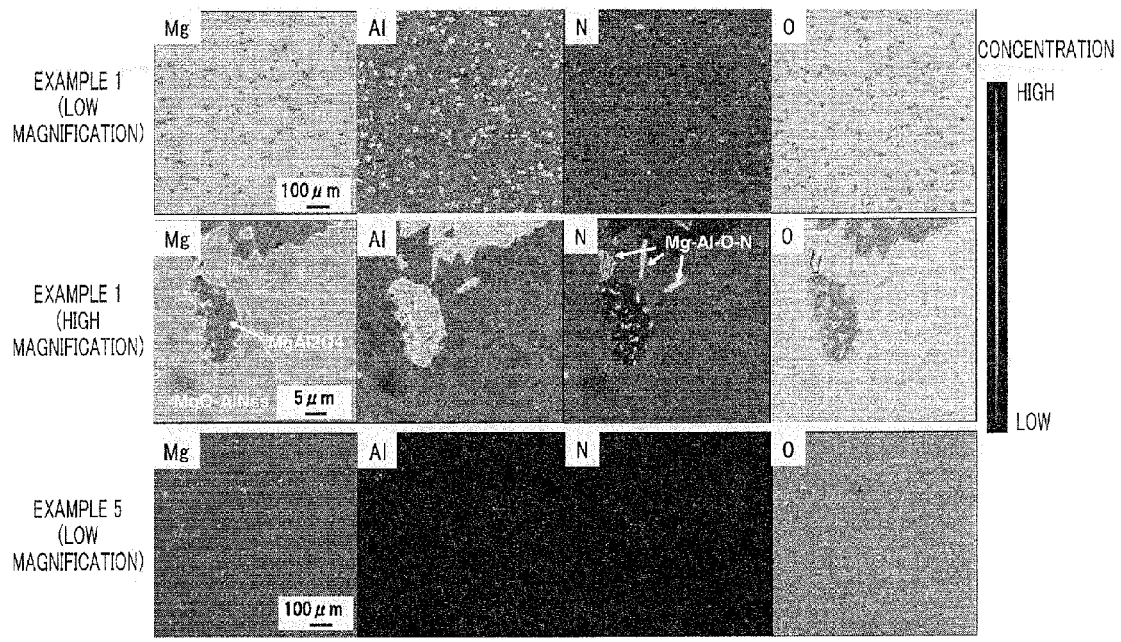
FIG. 3 illustrates element mapping images in Experimental Examples 1 and 5 by electron probe microanalysis (EPMA).

As shown in Tables 1 to 4, in each of Experimental Examples 1 to 3, 7 to 17, 21, and 24 to 28, the evaluation results of the crystal phase demonstrated the following facts: The ceramic material contained a MgO—AlN solid solution (MgO—AlNss) as a main phase, in which XRD peaks corresponding to the (111), (200), and (220) planes of the MgO—AlN solid solution appear at 2θ=36.9 to 39°, 42.9 to 44.8°, and 62.3 to 65.2°, respectively, the XRD peaks being located between peaks of cubic magnesium oxide and peaks of cubic aluminum nitride. The ceramic material contained magnesium-aluminum oxynitride (Mg—Al—O—N) and spinel (MgAl$_2$O$_4$) as subphases, each of magnesium-aluminum oxynitride and spinel showing an XRD peak at least 2θ=47 to 49°. However, the ceramic material did not contain AlN. As typical examples, FIG. 1 shows an X-ray diffraction (XRD) analysis chart of Experimental Example 1. FIG. 2 shows an enlarged view of the peak of a MgO—AlN solid solution in the XRD analysis chart of Experimental Example 1. Furthermore, Tables 1 and 3 show positions of the peak maxima corresponding to the (111), (200), and (220) planes of the MgO—AlN solid solution in each of Experimental Examples 1 to 28, the peak spacing (peak shift) between the XRD peak maximum corresponding to the (220) plane of the MgO—AlN solid solution and the peak maximum of magnesium oxide, and the integral breadth of the XRD peak corresponding to the (200) plane of the MgO—AlN solid solution. In each of Experimental Examples 6 to 11, 13, 16, 17, and 19 to 21, the peak of spinel overlapped significantly with the peak corresponding to the (111) plane of the MgO—AlN solid solution, failing to identify the peak maximum corresponding to the (111) plane. In this case, the position of the peak maximum corresponding to the (111) plane was not described in Table 3. It is thought that a larger peak shift indicates higher solid solubility. It is thought that a smaller integral breadth indicates a more uniform state of the solid solution. Note that XRD analysis charts in Experimental Examples 2, 3, 7 to 17, 20, 21, and 24 to 28 are not shown because the proportions of the MgO—AlN solid solution, the magnesium-aluminum oxynitride, and spinel were different from those in Experimental Example 1. Here, the main phase indicates a component whose volume fraction is 50% or more. The subphase indicates a phase other than the main phase, XRD peaks of the subphase being identified. It is thought that in the observation of a cross section, the area fraction shows the volume fraction. Thus, the main phase is defined as a region having an area fraction of 50% or more in an element mapping image obtained by EPMA. The subphase is defined as a region other than the main phase. In Experimental Example 20, similarly to Experimental Example 1 and so forth, the material contained three components: the MgO—AlN solid solution, magnesium-aluminum oxynitride, and spinel. However, the amounts of the components were not so different, so there is no component serving as a main phase. The material was a composite material. Thus, the foregoing three components were described in the sections of the main phase and the subphase in Table 3. Element mapping images in Experimental Examples 1 by EPMA were illustrated in FIG. 3. As is clear from FIG. 3, the main phase in Experimental Example 1 is mainly composed of Mg and O. In addition, Al and N are also detected. Hence, the main phase is the MgO—AlN solid solution illustrated in FIGS. 1 and 2. Furthermore, a spinel portion and a few magnesium-aluminum oxynitride portions are observed as subphases. FIG. 3 demonstrated that the MgO—AlN solid solution had an area fraction of about 86% and thus the MgO—AlN solid solution served as a main phase in Experimental Example 1. The same analysis was conducted on other experimental examples and revealed that, for example, the area fractions of the MgO—AlN solid solutions in Experimental Examples 15, 26, and 28 were about 75%, about 91%, and about 99%, respectively, and thus the MgO—AlN solid solutions served as the main phases. Here, as an example, the identification of the main phase and the subphase were performed by the element mapping by EPMA. Alternatively, any other methods that can distinguish the volume fractions of the phases may be employed.

In the element mapping images by EPMA, different concentrations are indicated by different colors: red, orange, yellow, yellowish green, green, blue, and indigo blue. Red indicates the highest concentration. Indigo blue indicates the lowest concentration. Black indicates zero. While FIG. 3 illustrates monochrome images, the images of FIG. 3 will be described below using the original colors. In Experimental Example 1 (low magnification), for Mg, the background was indicated by orange, and dot portions were indicated by blue. For Al, the background was indicated by blue, and the dot portions were indicated by orange. For N, the background was indicated by blue, and the dot portions were indicated by indigo blue. For O, the background was indicated by orange, and the dot portions were indicated by red. In Experimental Example 1 (high magnification), for Mg, the background (MgO—AlNss) was indicated by orange, an island portion (MgAl$_2$O$_4$) was indicated by blue, and linear portions (Mg—Al—O—N) were indicated by green. For Al, the background was indicated by blue, and the island portion and linear portions were indicated by orange. For N, the background was indicated by blue, the island portions were indicated by indigo blue, and linear portions were indicated by green. For O, the background was indicated by orange, the island portions were indicated by red, and linear portions were indicated by green. In Experimental Example 5 (low magnification), the images for Mg and O were indicated by red, and the images for Al and N were indicated by black.

From the evaluation results of the crystal phase, the ceramic material in each of Experimental Examples 4 and 23 contained the MgO—AlN solid solution, as described above, as a main phase. In Experimental Example 23, AlN was contained as a subphase. In Experimental Example 4, spinel and AlN were contained as subphases. Table 1 shows the peak spacing (peak shift) between the XRD peak of the MgO—AlN solid solution and the XRD peak of magnesium oxide in each of Experimental Examples 4 and 23. It was speculated that in Experimental Example 4, reactions did not adequately occur at a sintering temperature of 1650° C., thus resulting in low solid solubility. At a sintering temperature of 1600° C., substantially no reaction occurred. Thus, in the ceramic materials prepared in Experimental Examples 18 and 19, the MgO—AlN solid solution was not formed.

Furthermore, the ceramic material prepared in Experimental Example 5 contained MgO as serving a main phase. The ceramic material prepared in Experimental Example 6 contained spinel serving as a main phase and MgO serving as a subphase. The ceramic material prepared in Experimental Example 22 contained MgO serving as a main phase and spinel serving as a subphase. The results demonstrated that when the AlN component was not contained in the raw materials, the Al component did not form a solid solution with MgO by any of hot pressing and normal pressure sintering.

In the case of the ceramic material prepared in each of Experimental Examples 1 to 3, 7 to 13, 17, 20, and 21, the rate of water loss (the rate of mass decrease measured by TG-DTA at 40° C. to 500° C.) was 2% or less. In the case of the ceramic material prepared in each of Experimental Examples 4, 6, and 14 to 16, the rate of water loss was 3% or less. They had very high moisture resistance, compared with the ceramic material, MgO, prepared in Experimental Example 5. As typical examples of the moisture resistance test and the water resistance test of the bulk materials, photographs of microstructures in Experimental Examples 2 and 5 are illustrated in FIG. 4, and photographs of microstructures in Experimental Examples 8 and 9 are illustrated in FIG. 5. A higher solid solubility resulted in higher moisture resistance of the bulk materials. In each of Experimental Examples 1 to 3, 7 to 14, 17, 20, 21, and 26, in which the peak shift of the peak corresponding to the (220) plane of the MgO—AlN solid solution from magnesium oxide was 0.2° or more, when the moisture resistance test of the bulk material (exposure to the atmosphere at 40° C. and 90 RH % for 28 days) was performed, the surface state remained unchanged and was satisfactory. In each of Experimental Examples 4, 15, 16, 23 to 25, 27, and 28, when the moisture resistance test of the bulk material was performed, the surface state was changed. However, the degree of change was low, compared with Experimental Examples 5, 6, 18, 19, and 22, in which acicular and granular deposits were formed on 40% or more of the surface. The results demonstrated that the moisture resistance of the bulk material depends on the solid solubility of Al and N components dissolved in MgO. That is, the material in which the peak shift of the peak corresponding to the (220) plane of the MgO—AlN solid solution from magnesium oxide was less than 0.03° was changed on 40% or more of the surface and thus had low moisture resistance. When the peak shift was 0.03° or more and less than 0.2°, the material had high moisture resistance. When the peak shift was 0.2° or more, the material had higher moisture resistance. That is, when the XRD peak corresponding to the (220) plane of the MgO—AlN solid solution appeared at 62.33°≤2θ<62.50°, the XRD peak being located between a peak of cubic magnesium oxide and a peak of cubic aluminum nitride, the material had high moisture resistance. When the XRD peak appeared at 2θ=62.50° or more, the material had higher moisture resistance. When the XRD peak corresponding to the (200) plane of the MgO—AlN solid solution appeared at 42.92°≤2θ<43.04°, the XRD peak being located between a peak of cubic magnesium oxide and a peak of cubic aluminum nitride, the material had high moisture resistance. When the XRD peak appeared at 2θ=43.04° or more, the material had higher moisture resistance.

It was found that the bulk material having a larger peak shift and a smaller integral breadth had higher water resistance. That is, in each of Experimental Examples 1, 2, 7, 8, to 13, 17, and 20, in which the peak shift of the XRD peak corresponding to the (220) plane was 0.42° or more and in which the integral breadth was 0.35° or less, when the water resistance test of the bulk material was performed, the surface state remained unchanged. In each of Experimental Examples 3, 9, 14, 15, and 23 to 28, when the water resistance test of the bulk material was performed, a small number of holes due to elution were observed. In each of Experimental Examples 4 to 6, 16, 18, 19, and 22 and in Experimental Example 21, in which the integral breadth exceeded 0.50°, the trace of elution was observed on 40% or more of the surface. The results demonstrated that the bulk material had satisfactory water resistance when the solid solubility of the Al and N components in MgO was higher and the solid solution was uniform. That is, the material in which the peak shift of the peak corresponding to the (220) plane of the MgO—AlN solid solution from magnesium oxide was 0.05° or less had low water resistance because 40% or more of the surface was eluted. The material in which the peak shift was 0.05° or more and less than 0.42° had high water resistance. The material in which the peak shift was 0.42° or more but in which the integral breadth of the peak corresponding to the (200) plane of the MgO—AlN solid solution exceeded 0.35° had high water resistance. The material in which the peak shift was 0.42° or more and in which the integral breadth was 0.35° or less had higher water resistance. That is, when the XRD peak corresponding to the (220) plane of the MgO—AlN solid solution appeared at 62.35°≤2θ<62.72°, the XRD peak being located between a peak of cubic magnesium oxide and a peak of cubic aluminum nitride, the material had high water resistance. When the XRD peak corresponding to the (220) plane appeared at 2θ=62.72° or more and when the integral breadth of the peak corresponding to the (200) plane exceeded 0.35°, the material had high water resistance. The material in which the XRD peak corresponding to the (220) plane appeared at 2θ=62.72° or more and in which the integral breadth was 0.35° or less had higher water resistance. When the XRD peak corresponding to the (200) plane of the MgO—AlN solid solution appeared at 42.95°≤2θ<43.17°, the XRD peak being located between a peak of cubic magnesium oxide and a peak of cubic aluminum nitride, the material had high water resistance. The material in which the XRD peak appeared at 2θ=43.17° or more had higher water resistance.

The evaluation results of the etch rate demonstrated that the ceramic material prepared in each of Experimental Examples 1 to 3, 12, and 14 to 16 had high corrosion resistance comparable to that of the MgO ceramic material prepared in Experimental Example 5. The evaluation results of the etch rate demonstrated that the ceramic material prepared in each of Experimental Examples 4, 7 to 11, 13, and 21 had corrosion resistance slightly lower than that of MgO prepared in Experimental Example 5 but higher than those of the ceramic material, which had spinel as a main phase, prepared in Experimental Example 6 and yttria (not shown in the table, etch rate: about 240 nm/h). The ceramic material prepared in each of Experimental Examples 1 to 3 and 7 to 15 contained the magnesium-aluminum oxynitride (Mg—Al—O—N) phase as a subphase. A higher Mg—Al—O—N phase content resulted in higher mechanical properties. Upon letting the XRD peak intensity of the magnesium-aluminum oxynitride phase observed at 2θ=47 to 49° be A, and letting the intensity of the XRD peak corresponding to the (220) plane of the MgO—AlN solid solution observed at 2θ=62.3 to 65.2° be B, the value of A/B was described in Tables 2 and 4. A higher value of A/B indicated a higher Mg—Al—O—N content. A higher value of A/B resulted in higher fracture toughness and higher bending strength. In each of Experimental Examples 7 to 11, 13, 15, 17, 20, and 21, in which the value of A/B was 0.03 or more, it was found that the ceramic material had a fracture toughness of 2.5 or more and a high bending strength of 180 MPa or more. In each of Experimental Examples 7 to 10, 13, 15, 17, 20, and 21, it was found that the ceramic material had a high bending strength of 200 MPa or more. For example, in Experimental Example 8, A was 4,317 counts, B was 83,731 counts, the value of A/B was 0.039, the fracture toughness was 2.5, and the strength was 222 MPa. In Experimental Example 15, A was 13,566 counts, B was 108,508 counts, the value of A/B was 0.125, the fracture toughness was 4.4, and the strength was 350 MPa. However, an increase in magnesium-aluminum oxynitride (Mg—Al—O—N) content resulted in a reduction in the proportion of the MgO—AlN solid solution having high corrosion resistance, thus reducing the corrosion resistance. For example, in Experimental Example 17, in which the value of A/B was 0.3 or more, the etch rate reached 181 nm/h. In Experimental Example 20, in which the value of A/B exceeded 0.4, the corrosion resistance was the same level as that of spinel. The results demonstrated that a value of A/B of 0.03 to 0.14 resulted in good corrosion resistance and good mechanical strength. In Experimental Example 13, the bending strength was 188 MPa on the first measurement. To check the reproducibility, the bending strength was measured again and found to be 251 MPa. Furthermore, values of a/b calculated using the peak areas a and b were described in Tables 2 and 4.

The volume resistivity of the ceramic material prepared in each of Experimental Examples 2, 3, 8, 10, 15, 23, and 26 was $1 \times 10^{17}$ Ωcm or more at room temperature. The value of the volume resistivity was comparable to that of MgO prepared in Experimental Example 5. The results demonstrated that the ceramic material can be suitably used for members, such as electrostatic chucks and heaters, required to have high resistance for use in semiconductor manufacturing equipment.

The volume resistivities of the ceramic materials prepared in Experimental Examples 5 and 12 were $2 \times 10^{12}$ Ωcm and $2 \times 10^{10}$ Ωcm, respectively, at 600° C. The ceramic material prepared in Experimental Example 12 had a low electrical resistance, compared with MgO (Experimental Example 5). As with Experimental Example 12, it was found that the ceramic material prepared in each of Experimental Examples 1, 3, and 23 to 28 also had a low electrical resistance, compared with Experimental Example 5.

Upon letting the area of the XRD peak of the magnesium-aluminum oxynitride phase observed at 2θ=47 to 49° be a, letting the area of the XRD peak corresponding to the (220) plane of the MgO—AlN solid solution observed at 2θ=62.3 to 65.2° be b, letting the area of the XRD peak corresponding to the (400) plane of spinel ($MgAl_2O_4$) observed at about 2θ=45.0° be c, and letting the area of the XRD peak corresponding to the (002) plane of aluminum nitride (AlN) at about 2θ=36.0° be d, the value of (a+c+d)/(a+b+c+d) was described in Tables 2 and 4. A lower value of (a+c+d)/(a+b+c+d) indicates a higher MgO—AlN solid solution content of the ceramic material and a smaller total amount of the magnesium-aluminum oxynitride phase, spinel (MgAl$_2$O$_4$), and aluminum nitride (AlN), which can function as heterophases. In Experimental Examples 1 to 3, 5, 12, 14, and 23 to 28, the value of (a+c+d)/(a+b+c+d) was 0.1 or less. It was found that these ceramic materials each having a low heterophase content were suitably used for sputtering target members. For example, in Experimental Example 14, a was 782 counts, b was 123,644 counts, c was 2,613 counts, d was zero counts, and the value of (a+c+d)/(a+b+c+d) was 0.027, which indicated that the ceramic material had a low heterophase content. Similarly, in Experimental Example 23, a was zero counts, b was 109,166 counts, c was zero counts, d was 2,775 counts, and the value of (a+c+d)/(a+b+c+d) was 0.025, which indicated that the ceramic material had a low heterophase content.

As described above, each of the resulting ceramic materials maintains the crystal structure of magnesium oxide and has a lower electrical resistance than magnesium oxide. This is presumably because aluminum and nitrogen form a solid solution with crystalline magnesium oxide, thereby increasing the number of carriers in magnesium oxide. Thus, when the material is used as a sputtering target to produce, for example, a magnetic head for use in a hard disk or a magnetic tunnel junction device, such as a magnetoresistive random access memory, the electrical resistance and/or magnetoresistance ratio should be improved.

This application claims the benefit of Japanese Patent Application No. 2010-238999, filed Oct. 25, 2010, Japanese Patent Application No. 2011-135313, filed Jun. 17, 2011, and International Patent Application No. PCT/JP2011/69491, filed Aug. 29, 2011, which are hereby incorporated by reference herein in their entirety.

Industrial Applicability

A ceramic material of the present invention is used for a member for use in semiconductor manufacturing equipment. Examples of the member include electrostatic chucks, susceptors, heaters, plates, inner wall materials, monitoring windows, microwave-introducing windows, and microwave coupling antennae. Alternatively, the ceramic material of the present invention is used for a sputtering target member configured to produce magnetic tunnel junction devices, such as magnetic heads of hard disks and magnetoresistive random access memories.

The invention claimed is:

1. A ceramic material comprising:
   magnesium, aluminum, oxygen, and nitrogen, which are main components,
   wherein the ceramic material has a crystal phase of a MgO—AlN solid solution in which aluminum nitride is dissolved in magnesium oxide, the crystal phase serving as a main phase; and
   wherein XRD peaks corresponding. to (200) and (220) planes of the MgO—AlN solid solution measured with CuKα radiation appear at 2θ=42.9 to 44.8° and 62.3 to 65.2°, respectively, the XRD peaks being located between peaks of cubic magnesium oxide and peaks of cubic aluminum nitride.

2. The ceramic material according to claim 1, wherein XRD peaks corresponding to the (111) planes of the MgO—AlN solid solution measured with CuKα radiation appear at 2θ=36.9 to 39°, the XRD peaks being located between peaks of cubic magnesium oxide and peaks of cubic aluminum nitride.

3. The ceramic material according to claim 1, wherein XRD peaks corresponding to the (200) and (220) planes of the MgO—AlN solid solution appear at 2θ=42.92° or more and 62.33° or more, respectively.

4. The ceramic material according to claim 1, wherein XRD peaks corresponding to the (200) and (220) planes of the MgO—AlN solid solution appear at 2θ=42.95° or more and 62.35° or more, respectively.

5. The ceramic material according to claim 1, wherein XRD peaks corresponding to the (200) and (220) planes of the MgO—AlN solid solution appear at 2θ=43.04° or more and 62.50° or more, respectively.

6. The ceramic material according to claim 1, wherein XRD peaks corresponding to the (200) and (220) planes of the MgO-AlN solid solution appear at 2θ=43.17° or more and 62.72° or more, respectively.

7. The ceramic material according to claim 3, wherein the integral breadth of an XRD peak corresponding to the (200) plane of the MgO—AlN solid solution is 0.50° or less.

8. The ceramic material according to claim 3, wherein the integral breadth of an XRD peak corresponding to the (200) plane of the MgO—AlN solid solution is 0.35° or less.

9. The ceramic material according to claim 3, wherein the ceramic material does not contain an AlN crystal phase.

10. The ceramic material according to claim 3, wherein the ceramic material contains a magnesium-aluminum oxynitride phase as a subphase, wherein an XRD peak of the magnesium-aluminum oxynitride phase measured with CuKα radiation appears at at least 2θ=47 to 49°.

11. The ceramic material according to claim 10, wherein letting the XRD peak intensity of the magnesium-aluminum oxynitride phase observed at 2θ=47 to 49° be A, and letting the intensity of the XRD peak corresponding to the (220) plane of the MgO—AlN solid solution observed at 2θ=62.3 to 65.2° be B, the value of A/B is 0.03 or more.

12. The ceramic material according to claim 11, wherein the value of A/B is 0.14 or less.

13. The ceramic material according to claim 10, wherein letting the area of the XRD peak of the magnesium-aluminum oxynitride phase observed at 2θ=47 to 49° be a, letting the area of the XRD peak corresponding to the (220) plane of the MgO—AlN solid solution observed at 2θ=62.3 to 65.2° be b, letting the area of the XRD peak corresponding to the (400) plane of spinel (MgAl$_2$O$_4$) observed at 2θ=45.0° be c, and letting the area of the XRD peak corresponding to the (002) plane of aluminum nitride (AlN) at 2θ=36.0° be d, the value of (a +c +d)/(a +b +c +d) is 0.1 or less.

14. The ceramic material according to claim 3, wherein a precursor of the ceramic material is a mixed powder containing 49% by mass to 99% by mass magnesium oxide, 0.5% by mass to 25% by mass aluminum nitride, and 0.5% by mass to 30% by mass aluminum oxide.

15. The ceramic material according to claim 3, wherein a precursor of the ceramic material is a mixed powder containing 50% by mass to 75% by mass magnesium oxide, 5% by mass to 20% by mass aluminum nitride, and 15% by mass to 30% by mass aluminum oxide.

16. A member for use in semiconductor manufacturing equipment the member comprising the ceramic material according to claim 3.

17. A sputtering target member comprising the ceramic material according to claim 3.

18. A tunnel barrier of a magnetic tunnel junction device produced by the sputtering target member according to claim 17.

19. At least one magnetic tunnel junction device selected from magnetic heads of hard disks and magnetoresistive random access memories produced by the sputtering target member according to claim 17.

20. A method for producing a ceramic material according to claim 3, the method comprising a step of subjecting a mixed powder of magnesium oxide, aluminum oxide, and aluminum nitride to hot-press sintering in an inert atmosphere.

* * * * *